(12) United States Patent
Luo et al.

(10) Patent No.: US 10,637,334 B2
(45) Date of Patent: Apr. 28, 2020

(54) PRINTED CIRCUIT BOARD AND MOTOR

(71) Applicant: Johnson Electric S.A., Murten (CH)

(72) Inventors: Qing Bin Luo, Shenzhen (CN); Chi Wai Lai, Shenzhen (CN); Wen Ming Wu, Shenzhen (CN)

(73) Assignee: JOHNSON ELECTRIC INTERNATIONAL AG, Murten (CH)

( * ) Notice: Subject to any disclaimer, the term of this patent is extended or adjusted under 35 U.S.C. 154(b) by 222 days.

(21) Appl. No.: 15/597,890

(22) Filed: May 17, 2017

(65) Prior Publication Data

US 2017/0338722 A1    Nov. 23, 2017

(30) Foreign Application Priority Data

May 18, 2016  (CN) .......................... 2016 1 0333757

(51) Int. Cl.
| | |
|---|---|
| *H02K 11/30* | (2016.01) |
| *H02K 11/40* | (2016.01) |
| *H05K 1/02* | (2006.01) |
| *H05K 1/11* | (2006.01) |
| *H05K 1/16* | (2006.01) |
| *H02K 11/026* | (2016.01) |
| *H02K 13/10* | (2006.01) |

(52) U.S. Cl.
CPC .......... *H02K 11/30* (2016.01); *H02K 11/026* (2013.01); *H02K 11/40* (2016.01); *H02K 13/105* (2013.01); *H05K 1/0216* (2013.01); *H05K 1/11* (2013.01); *H05K 1/162* (2013.01); *H05K 2201/09009* (2013.01)

(58) Field of Classification Search
CPC ......... H02K 11/30; H02K 11/40; H05K 1/162
See application file for complete search history.

(56) References Cited

U.S. PATENT DOCUMENTS

| | | | |
|---|---|---|---|
| 8,878,074 B2 * | 11/2014 | Moeller | H05K 1/0231 |
| | | | 174/260 |
| 9,402,304 B2 * | 7/2016 | Shinkawa | B62D 5/0406 |
| 2009/0251846 A1 | 10/2009 | Lee et al. | |
| 2014/0083756 A1 | 3/2014 | Moeller et al. | |
| 2017/0317563 A1* | 11/2017 | Muraro | H02K 11/40 |
| 2018/0233992 A1* | 8/2018 | Takeuchi | B62D 5/0406 |

FOREIGN PATENT DOCUMENTS

| | | |
|---|---|---|
| CN | 101019476 A | 8/2007 |
| CN | 103227537 A | 7/2013 |
| TW | 200917914 A | 4/2009 |

* cited by examiner

*Primary Examiner* — William H. Mayo, III
*Assistant Examiner* — Hiram E Gonzalez
(74) *Attorney, Agent, or Firm* — Muncy, Geissler, Olds & Lowe, P.C.

(57) ABSTRACT

A printed circuit board includes a body, a first conductive pattern layer disposed on a first surface of the body, and a second conductive pattern layer disposed on a second surface of the body. The first conductive pattern layer and the second conductive pattern layer form a capacitor. The present disclosure further provides an motor having the printed circuit board.

14 Claims, 5 Drawing Sheets

PRINTED CIRCUIT BOARD AND MOTOR

CROSS REFERENCE TO RELATED APPLICATIONS

This non-provisional patent application claims priority under 35 U.S.C. § 119(a) from Patent Application No. 201610333757.1 filed in The People's Republic of China on May 18, 2016.

FIELD OF THE INVENTION

The present disclosure relates to driving devices, and in particular to a printed circuit board and a motor using the printed circuit board.

BACKGROUND OF THE INVENTION

A printed circuit board for a motor, electronic components such as capacitors and resistors are generally directly welded to the printed circuit board. Due to large sizes of these electronic components and gaps between components installed on the printed circuit board, the printed circuit board has a large size. In addition, these electronic components are grounded through pins, and parasitic inductance and parasitic capacitance of the pins themselves result in the motors having large electromagnetic radiation.

SUMMARY OF THE INVENTION

Some of features and advantages of the present disclosure are described in the following description, or are obvious from the description, or may be learned through practicing the present disclosure.

The present disclosure provides a printed circuit board including a body, a first conductive pattern layer disposed on a first surface of the body, and a second conductive pattern layer disposed on a second surface of the body. The first conductive pattern layer and the second conductive pattern layer form a capacitor.

Preferably, the first surface of the body is partially coated by the first conductive pattern layer.

Preferably, a location hole is defined in a central region of the body, and the first conductive pattern layer is disposed at two opposite sides of the location hole.

Preferably, the second conductive pattern layer completely covers the second surface of the body.

Preferably, the first conductive pattern layer and the second conductive pattern layer are metal coating layers.

Preferably, power supply through slots are defined in a portion of the body which is covered by the first conductive pattern layer, for connecting with power terminals.

Preferably, grounding through slots are defined in a portion of the body which is not covered by the first conductive pattern layer, for grounding the printed circuit board.

Preferably, a plurality of component through holes is defined in the body, for connecting of electronic components.

The present disclosure further provides a printed circuit board including a body with a capacitor formed thereon. The capacitor includes a first conductive pattern layer disposed on a first surface of the body and a second conductive pattern layer disposed on a second surface of the body.

The present disclosure further provides a motor including the above printed circuit board.

According to the printed circuit board and the motor including the printed circuit board of the present disclosure, the first conductive pattern layer and the second conductive pattern layer are directly formed on the body of the printed circuit board to form a capacitor, thereby reducing volumes of the electronic components. Further, the capacitor is grounded directly through the grounding through slot without using pins of the electronic components to ground, thereby effectively reducing the electromagnetic radiation of the motor.

By reading this disclosure, those skilled in the art can better understand the features and contents of the technical solutions.

BRIEF DESCRIPTION OF THE DRAWINGS

In order to make advantages and implementation of the present disclosure more apparent, embodiments of the present disclosure are described below in detail with reference to the drawings. Contents illustrated in the drawings are only used to explain and illustrate the present disclosure without limiting the present disclosure. In the drawings.

DETAILED DESCRIPTION OF THE PREFERRED EMBODIMENTS

Before embodiments of the present disclosure are described in detail, it is to be understood that the present disclosure is not limited to the details of construction and the arrangement of components set forth in the following description or illustrated in the following drawings. The present disclosure is capable of other embodiments. Also, it is to be understood that the phraseology and terminology used herein is for the purpose of description and should not be regarded as limiting. The use of "including", "comprising", or "having" and variations thereof herein is meant to encompass the items listed thereafter and equivalents thereof as well as additional items. Particularly, the use of indefinite article "a" or "an" associated with an item does not carry the meaning of a single one of the item, but rather, one or more such items can be included.

Figure 1:
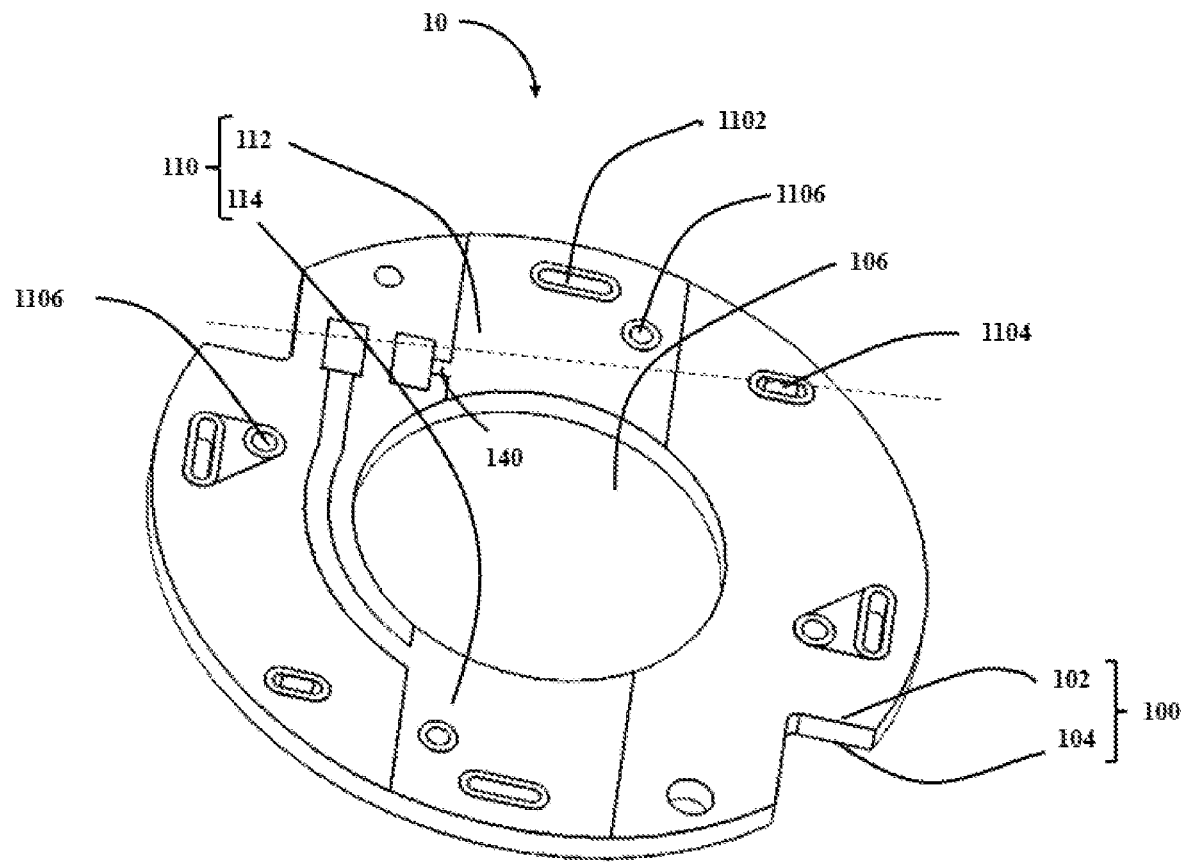
FIG. 1 is a perspective view of one embodiment of a printed circuit board of the present disclosure.
Figure 2:
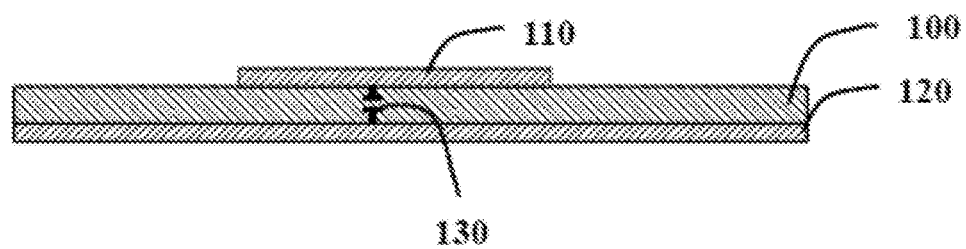
FIG. 2 is a schematic view showing laminated structure of the printed circuit board shown in FIG. 1.

Referring to FIG. 1 and FIG. 2, a printed circuit board 10 of the present disclosure includes a body 100. The body 100 includes a first surface 102 and an opposite second surface 104. In this embodiment, the body 100 is a circular disc-shaped body. Alternatively, the body 100 may be a square body or a body of another shape.

A location hole 106 is defined in a central region of the body 100. The location hole 106 can be sized according to application environment of the printed circuit board 10. For example, when the printed circuit board 10 is applied in a motor, the size of the location hole 106 can be determined according to a diameter of a rotary shaft of the motor.

A first conductive pattern layer 110 is disposed on the first surface 102, and a second conductive pattern layer 120 is disposed on the second surface 102. The first conductive pattern layer 110 partially covers the first surface 102. The first conductive pattern layer 110 includes a first conductive pattern sub-layer 112 and a second conductive pattern sub-layer 114 which are disposed at two opposite sides of the location hole 106. The second conductive pattern layer 120 completely covers the second surface 104. The first conductive pattern layer 110, the body 100 and the second conductive pattern layer 120 form a capacitor 130. The first conductive pattern layer 110 and the second conductive pattern layer 120 act as two electrodes of the capacitor 130, respectively. Capacitance of the capacitor 130 may be adjusted by changing an area of the first conductive pattern layer 110 or the second conductive pattern layer 120. In this embodiment, the capacitance of the capacitor 130 is adjusted by only changing the area of the first conductive pattern layer 110, and an area of the first conductive pattern sub-layer 112 is equal to an area of the second conductive pattern sub-layer 114. The capacitor 130 is a grounding capacitor, which is grounded via a trace 140. The first conductive pattern layer 110 is grounded via the trace 140.

In this embodiment, the first conductive pattern layer 110 and the second conductive pattern layer 120 are metal coating layers. Preferably, the metal coating layer is made of metal such as copper, silver and gold or an alloy. The metal coating layer has a thickness of 0.038 mm.

In this embodiment, the body 100 is made of insulated material, such as, polyimide, epoxy resin or the like.

Power supply through slots 1102 are defined in a portion of the body 100 covered by the first conductive pattern layer 110, for connecting with power terminals. Grounding through slots 1104 are defined in the body 100 between the first conductive pattern sub-layer 112 and the second conductive pattern sub-layer 114, i.e. in another portion of the body 100 not covered by the first conductive pattern layer 110, for grounding through an outer housing of the motor.

Multiple component mounting holes 1106 are further defined in the body 100, for connecting electronic components such as inductors and capacitors. Some of the component mounting holes 1106 are disposed in a portion of the body 100 which is covered by the first conductive pattern layer 110, and the other component mounting holes 1106 are disposed in a portion of the body 100 which is not covered by the first conductive pattern layer 110. In this embodiment, the electronic components such as inductors and resistors are surface mount devices to reduce the volume of the printed circuit board 10. The component mounting holes 1106 may be circular through holes.

Figure 3:
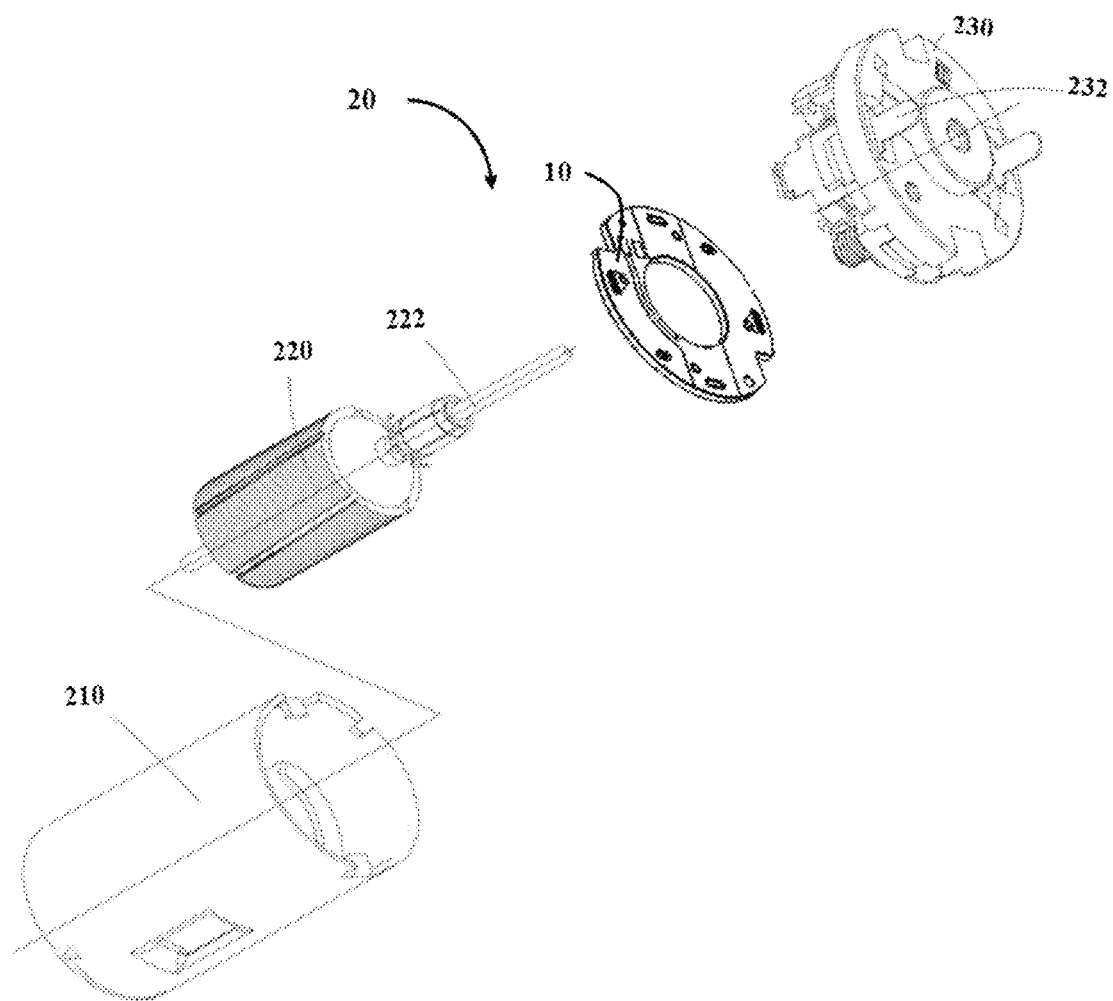
FIG. 3 is an exploded view of one embodiment of an motor of the present disclosure.

Referring also to FIG. 3, FIG. 3 is an exploded view of a motor 20 according to one embodiment of the present disclosure. The motor 20 includes a stator assembly 210, a rotor assembly 220 rotatably connected to the stator assembly 210 and including a rotary shaft 222, an endcap assembly 230 fixedly mounted to an end of the stator assembly 210 for supporting the rotor assembly 220, and the printed circuit board 10. The rotary shaft 222 extends through the location hole 106. In this embodiment, the motor 20 is a direct current motor. The stator assembly 210 and the rotor assembly 220 generate magnetic fields that interact with each other to cause the rotor assembly 220 to rotate. The rotary shaft 222 extends through the location hole 106 and the endcap assembly 230 so as to output power generated by the motor 20.

The body 100 further includes a pair of cutouts 118 defined in a ring portion between the first conductive pattern sub-layer 112 and the second conductive pattern sub-layer 114 so as to facilitate installing the printed circuit board 10 in the stator assembly 210.

The endcap assembly 230 is provided with connection terminals 232. The power supply through slots 1102 are connected to the connection terminals 232 via power wires (not shown). The grounding through slots 1104 are connected to the stator assembly 210.

Figure 4:
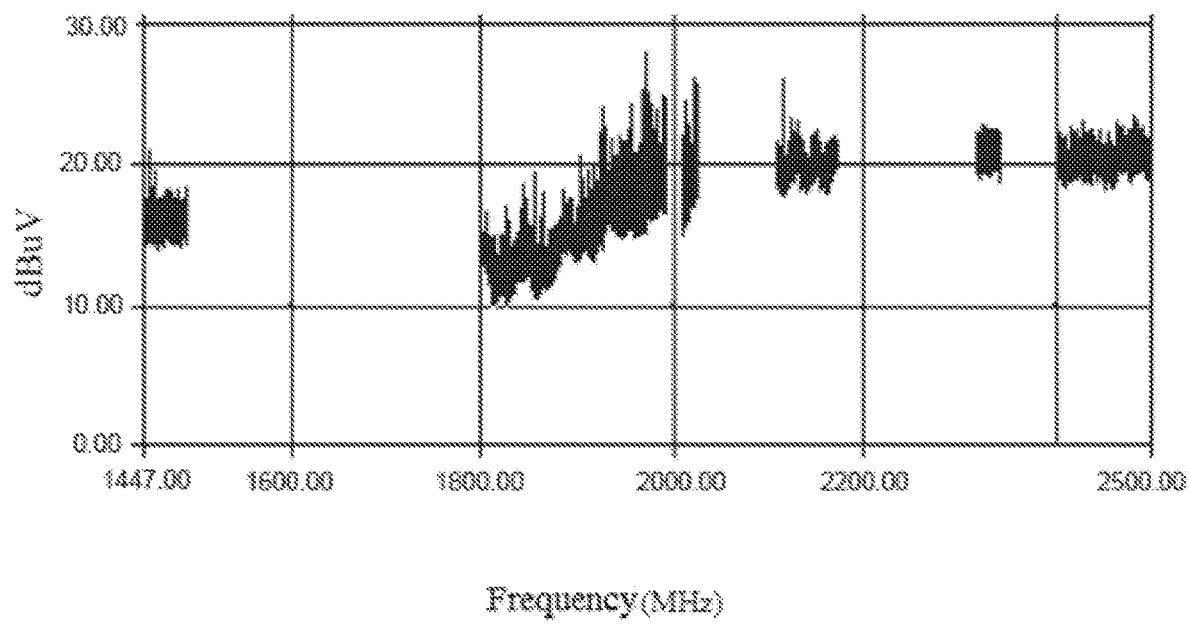
FIG. 4 is a schematic diagram showing radiation EMI test of the motor of the present disclosure.
Figure 5:
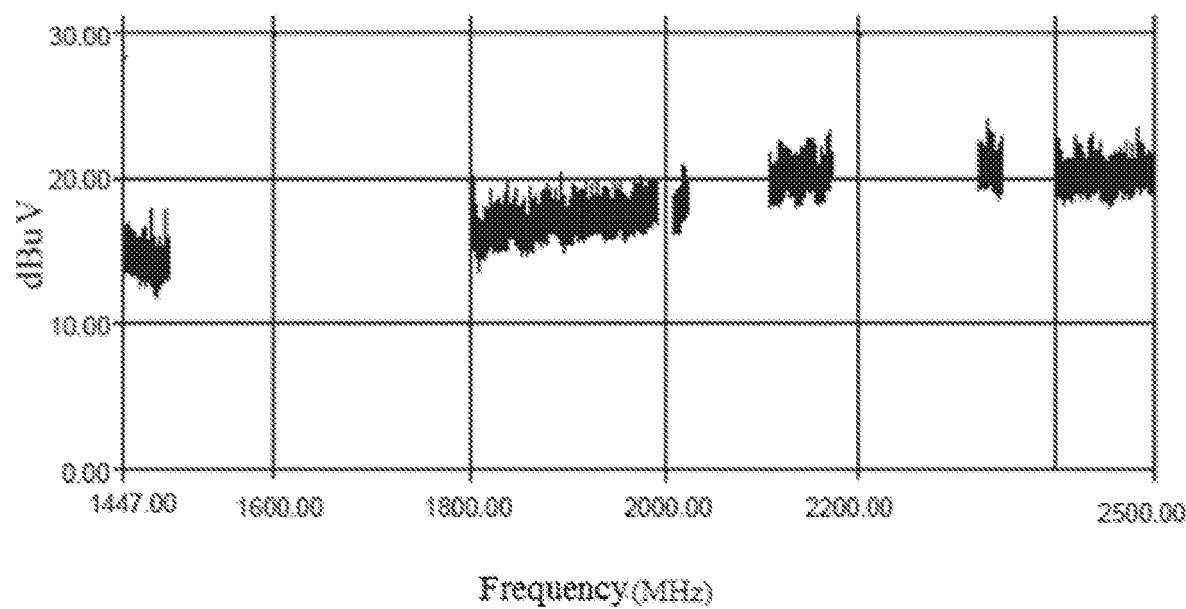
FIG. 5 is a schematic diagram showing radiation EMI test of a conventional motor.

Referring also to FIG. 4 and FIG. 5, FIG. 4 is a schematic diagram showing radiation EMI test of the motor of the present disclosure. FIG. 5 is a schematic diagram showing radiation EMI test of a conventional motor. A unit of the horizontal axis is MHz, which represents a frequency of EMI of the motor. A unit of the vertical axis is dBuV/m, which represents an amplitude of EMI of the motor. The smaller the value of the vertical axis, the better the EMI suppression effect of the motor. As can be seen from FIG. 4 and FIG. 5, for EMI at the same frequency, the radiation EMI of the motor of the present disclosure with the capacitor being directly formed on the printed circuit board is significantly lower than that of the conventional motor.

In the printed circuit board and the motor having the printed circuit board of the present disclosure, the first conductive pattern and the second conductive pattern are directly formed on the body of the printed circuit board to form a plate capacitor, thereby reducing volumes of the electronic components. Further, the capacitor is grounded directly through the grounding through slots without using pins of the electronic components to ground, thereby effectively reducing the electromagnetic radiation of the motor.

The preferred embodiments of the present disclosure have been described with reference to the drawings. Various modifications and variations will be apparent to those of ordinary skill in the art without departing from the spirit and scope of the present disclosure. For example, some features shown or described in one embodiment may be applied to another embodiment to obtain a further embodiment. The above descriptions are merely the preferred embodiments of the present disclosure and shall not be used to limit the scope of the present disclosure. Any improvements and modifications made without departing from the principle of the present disclosure shall also fall within the scope of the present disclosure.

The invention claimed is:

1. A printed circuit board comprising:
a body;
a first conductive pattern layer disposed on a first surface of the body; and
a second conductive pattern layer disposed on an opposite second surface of the body,
wherein the second conductive pattern layer covers the second surface of the body, and a capacitor is formed by the first conductive pattern layer and the second conductive pattern layer,
the first conductive pattern layer comprises a first conductive pattern sub-layer and a second conductive pattern sub-layer, and an area of the first conductive pattern sub-layer is equal to an area of the second conductive pattern sub-layer, and
power supply through slots are defined in a portion of the body which is covered by the first conductive pattern layer, for connecting with power terminals.

2. The printed circuit board according to claim 1, wherein the first surface of the body is partially coated by the first conductive pattern layer.

3. The printed circuit board according to claim 1, wherein a location hole is defined in a central region of the body, and the first conductive pattern layer is disposed at two opposite sides of the location hole.

4. The printed circuit board according to claim 3, wherein grounding through slots are defined in a portion of the body which is not covered by the first conductive pattern layer, for grounding the printed circuit board.

5. The printed circuit board according to claim 1, wherein the first conductive pattern layer and the second conductive pattern layer are metal coating layers.

6. The printed circuit board according to claim 1, wherein a plurality of component through holes is defined in the body, for connecting of electronic components.

7. A motor comprising a printed circuit board, the printed circuit board comprising:
a body;
a first conductive pattern layer disposed on a first surface of the body; and
a second conductive pattern layer disposed on an opposite second surface of the body,
wherein the second conductive pattern layer covers the second surface of the body, and a capacitor is formed by the first conductive pattern layer and the second conductive pattern layer,
the first conductive pattern layer comprises a first conductive pattern sub-layer and a second conductive pattern sub-layer, and an area of the first conductive pattern sub-layer is equal to an area of the second conductive pattern sub-layer, and
power supply through slots are defined in a portion of the body which is covered by the first conductive pattern layer, for connecting with power terminals.

8. The motor according to claim 7, wherein the first surface of the body is partially coated by the first conductive pattern layer.

9. The motor according to claim 7, wherein a location hole is defined in a central region of the body, and the first conductive pattern layer is disposed at two opposite sides of the location hole.

10. The motor according to claim 9, wherein grounding through slots are defined in a portion of the body which is not covered by the first conductive pattern layer, for grounding the printed circuit board.

11. The motor according to claim 7, wherein the first conductive pattern layer and the second conductive pattern layer are metal coating layers.

12. The motor according to claim 7, wherein a plurality of component through holes is defined in the body, for connecting of electronic components.

13. The motor according to claim 7, further comprising an endcap assembly, wherein the endcap assembly comprises a plurality of connection terminals to connect the power supply through slots.

14. The motor according to claim 10, further comprising a stator assembly, wherein the grounding through slots are connected to the stator assembly.

\* \* \* \* \*